United States Patent
Nishimura (10) Patent No.: US 7,499,479 B2
(45) Date of Patent: Mar. 3, 2009

(54) LASER DIODE DRIVER CIRCUIT AND OPTICAL COMMUNICATION DEVICE

(75) Inventor: Kazuko Nishimura, Uji (JP)

(73) Assignee: Panasonic Corporation, Osaka (JP)

( * ) Notice: Subject to any disclaimer, the term of this patent is extended or adjusted under 35 U.S.C. 154(b) by 425 days.

(21) Appl. No.: 11/001,075

(22) Filed: Dec. 2, 2004

(65) Prior Publication Data

US 2005/0123013 A1 Jun. 9, 2005

(30) Foreign Application Priority Data

Dec. 3, 2003 (JP) .............................. 2003-404435

(51) Int. Cl.
*H01S 5/00* (2006.01)
(52) U.S. Cl. ................ 372/38.1; 372/38.01; 372/38.02; 372/38.07
(58) Field of Classification Search ............. 372/38.03, 372/38.07, 38.02, 38.1, 38.01
See application file for complete search history.

(56) References Cited

U.S. PATENT DOCUMENTS 6,195,370 B1 * 2/2001 Haneda et al. ........... 372/29.01

2002/0071163 A1 * 6/2002 Tokita et al. ................. 359/187
2003/0048724 A1 * 3/2003 Sasaki et al. ............. 369/59.11
2006/0165139 A1 * 7/2006 Sanchez ................ 372/29.021

FOREIGN PATENT DOCUMENTS

JP 2000-203080 A 7/2000

* cited by examiner

*Primary Examiner*—Minsun Harvey
*Assistant Examiner*—Delma R Forde
(74) *Attorney, Agent, or Firm*—McDermott Will & Emery LLP (57) ABSTRACT

A laser diode driver circuit includes: a current source for generating a laser drive current which drives a laser diode; a switch for switching the passage/non-passage of the laser drive current into the laser diode; an APC circuit for controlling the magnitude of the laser drive current such that the optical output power of the laser diode is equal to a predetermined value; a switch control circuit for controlling the operation of the switch according to an input signal; and a ringing suppression circuit connected to an output terminal through which the laser drive current is supplied to the laser diode, the filter circuit having a variable time constant. Herein, the switch control circuit and the ringing suppression circuit respectively switch the drive power to the switch and the time constant in conjunction with the control of the magnitude of the laser drive current by the APC circuit.

4 Claims, 11 Drawing Sheets

(PRIOR ART)

FIG. 10

LASER DIODE DRIVER CIRCUIT AND OPTICAL COMMUNICATION DEVICE

CROSS-REFERENCE TO RELATED APPLICATION

This application claims priority under 35 U.S.C. §119(a) on Japanese Patent Application No. 2003-404435 filed on Dec. 3, 2003, the entire contents of which are hereby incorporated by reference.

BACKGROUND OF THE INVENTION

The present invention relates to a laser diode driver circuit for driving a laser diode and specifically to a laser diode driver circuit suitable for an optical communication device which performs data communication by driving a laser diode to emit light according to an input signal.

Figure 10:
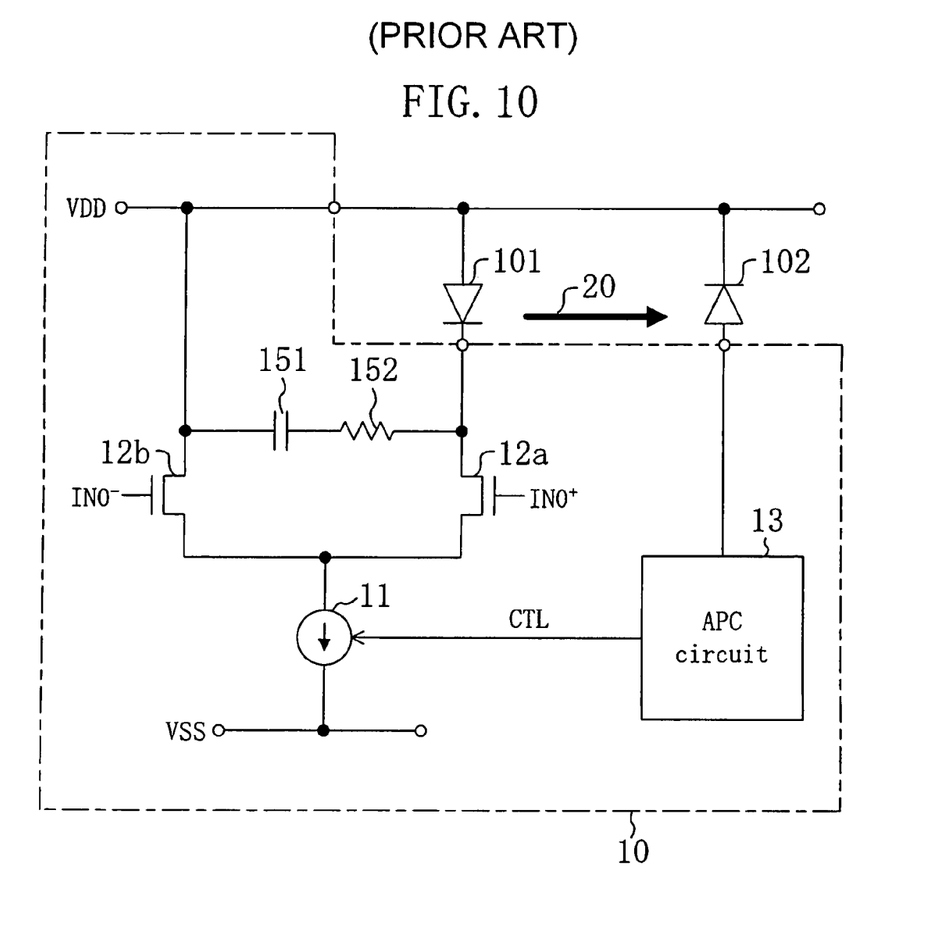
FIG. 10 shows a circuit structure of a conventional laser diode driver circuit.

FIG. 10 shows a circuit structure of a conventional laser diode driver circuit. The conventional laser diode driver circuit 10 includes: a current source 11 for generating a laser drive current for driving a laser diode 101 which performs current-to-light conversion; a switch transistor 12a which has a drain connected to the laser diode 101 and a source connected to the current source 11; a switch transistor 12b which has a drain connected to power supply VDD and a source connected to the current source 11; an APC (Auto Power Control) circuit 13 for feeding back a monitoring result of laser light 20 which is obtained by a photodiode 102 to the current source 11 to adjust the magnitude of the laser drive current such that the amount of the laser light 20 is always kept constant.

Differential switching signals IN0+ and IN0− are input to the gates of the switch transistors 12a and 12b, respectively. When the switch transistor 12a is ON and the switch transistor 12b is OFF, an electric current passes through the laser diode 101 so that the laser diode 101 emits the laser light 20. When the switch transistor 12a is OFF and the switch transistor 12b is ON, no electric current passes through the laser diode 101 so that the laser diode 101 does not emit the laser light 20.

In actuality, the operation of the laser diode driver circuit 10 having the above structure is influenced by the inductance and capacitive component parasitic to packages, leads and bonding wires of the laser diode 101 and the laser diode driver circuit 10 itself and the capacitive component parasitic to the output of the laser diode driver circuit 10. This influence is negligible when the operation frequency is relatively low. However, when the operation frequency is relatively high, especially when the operation frequency is higher than 1 Gbps, ringing which occurs at rising and falling edges of the output waveform of the laser diode driver circuit 10 cannot be neglected. For example, in the case where the laser diode driver circuit 10 is used in an optical communication device, if ringing occurs in emission of the laser diode 101, the reliability of high speed data communication is deteriorated. In the worst case, a critical defect, such as a data dropout, error data, or the like, occurs.

In view of such, inserting a filter circuit, which is formed by a capacitive element 151 and a resistive element 152 connected in series, between the drain of the switch transistor 12a and the drain of the switch transistor 12b to suppress the influence of ringing has conventionally been proposed (see, for example, Japanese Unexamined Patent Publication No. 2000-203080 (page 5, FIG. 1)).

In the above ringing suppression method, the time constant of the filter circuit is fixed to a constant value. Thus, the output waveform becomes blunt in return for suppression of the influence of ringing. Conversely, ringing or overshoot and undershoot remain unremoved in return for optimization of the rising and falling of the output waveform.

Figure 11:
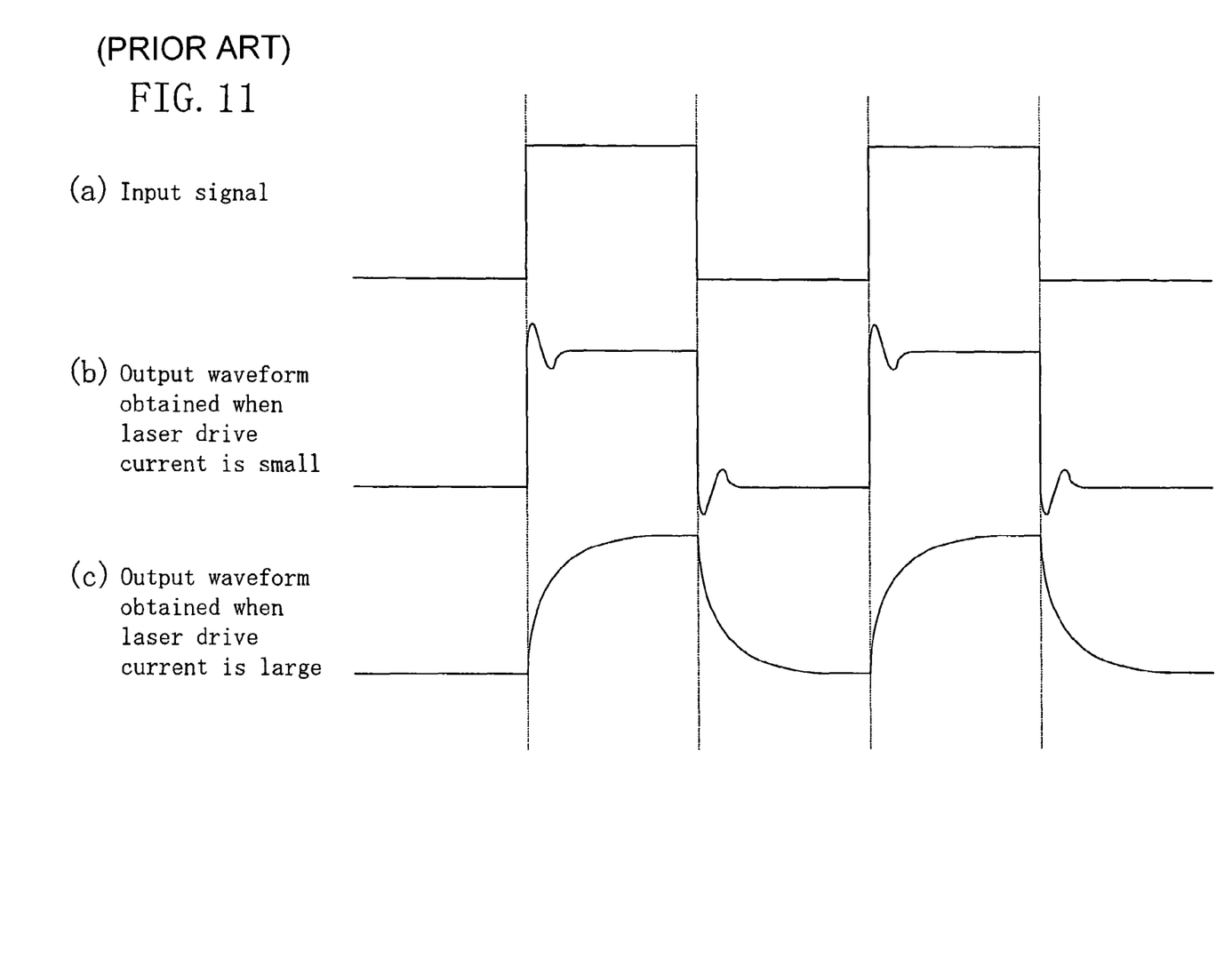
FIG. 11 is a graph illustrating the input/output characteristic of the conventional laser diode driver circuit.

FIG. 11 is a graph showing the input/output characteristic of the conventional laser diode driver circuit 10. In FIG. 11, line segment (a) shows an input signal to the conventional laser diode driver circuit 10; line segment (b) shows the output waveform obtained when the laser drive current is small; and line segment (c) shows the output waveform obtained when the laser drive current is large. As seen from line segment (b), when the laser drive current generated by the current source 11 is relatively small, overshoot and undershoot readily occur. As seen from line segment (c), when the laser drive current generated by the current source 11 is relatively large, the output waveform becomes blunt. Thus, when the laser drive current varies over a relatively wide range, it is difficult to obtain an optimum output waveform. In the case where a laser diode having a deteriorated output waveform is used in optical data communication, high speed response is not achieved, and data dropout, error data, or the like, occurs. As a result, the reliability of communication data decreases.

SUMMARY OF THE INVENTION

In view of the above, an objective of the present invention is to obtain an optimum output waveform in a laser diode driver circuit which drives a laser diode, especially in a laser diode driver circuit which drives a laser diode used in an optical communication device.

A measure taken by the present invention for achieving the above objective is a laser diode driver circuit for driving a laser diode, comprising: a current source for generating a laser drive current which is used for driving the laser diode; a switch for switching the passage/non-passage of the laser drive current into the laser diode; an optical output power control circuit for controlling the magnitude of the laser drive current based on a monitoring result as to the optical output power of the laser diode such that the optical output power is equal to a predetermined value; and a switch control circuit for controlling the operation of the switch according to an input signal. The switch control circuit switches the drive power to the switch in conjunction with the control of the magnitude of the laser drive current by the optical output power control circuit.

With the above structure, the drive power to the switch which switches the passage/non-passage of the laser drive current into the laser diode is switched in conjunction with the control of the magnitude of the laser drive current. Thus, the switch is driven with a drive power determined according to the magnitude of the laser drive current, and the output waveform of the laser diode driver circuit is optimally shaped.

Specifically, when the laser drive current is controlled to be large, the switch control circuit increases the drive power. When the laser drive current is controlled to be small, the switch control circuit decreases the drive power.

More specifically, the switch control circuit includes a plurality of buffer circuits between which electrical connection and disconnection are switchable; and the switch control circuit switches the drive power by changing the number of buffer circuits connected in parallel.

Specifically, when the laser drive current is controlled to be large, the switch control circuit increases the amplitude of a control signal which is used for controlling the switch. When the laser drive current is controlled to be small, the switch control circuit decreases the amplitude of the control signal.

Preferably, the size of the switch is changed in conjunction with the control of the magnitude of the laser drive current by the optical output power control circuit.

Another measure taken by the present invention for achieving the above objective is a laser diode driver circuit for driving a laser diode, comprising: a current source for generating a laser drive current which is used for driving the laser diode; a switch for switching the passage/non-passage of the laser drive current into the laser diode; an optical output power control circuit for controlling the magnitude of the laser drive current based on a monitoring result as to the optical output power of the laser diode such that the optical output power is equal to a predetermined value; and a switch control circuit for generating a differential signal based on an input signal and controlling the operation of the switch according to the differential signal, the differential signal being formed by first and second signals. The switch control circuit generates the differential signal such that the falling of the second signal is delayed with respect to the rising of the first signal.

With the above structure, a crosspoint can be shifted in the differential signal used for switching the passage/non-passage of the laser drive current into the laser diode. Thus, the time interval between the crosspoint in the differential signal and the time when the level at which the switch operates is reached is shortened, and overshoot in the output waveform of the laser diode driver circuit is prevented.

Still another measure taken by the present invention for achieving the above objective is a laser diode driver circuit for driving a laser diode, comprising: a current source for generating a laser drive current which is used for driving the laser diode; a switch for switching the passage/non-passage of the laser drive current into the laser diode; an optical output power control circuit for controlling the magnitude of the laser drive current based on a monitoring result as to the optical output power of the laser diode such that the optical output power is equal to a predetermined value; and a filter circuit connected to an output terminal through which the laser drive current is supplied to the laser diode, the filter circuit having a variable time constant. The filter circuit switches the time constant in conjunction with the control of the magnitude of the laser drive current by the optical output power control circuit.

With the above structure, the time constant of the filter circuit which produces the effect of suppressing the ringing in the output waveform of the laser diode driver circuit is switched in conjunction with the control of the magnitude of the laser drive current. Thus, the time constant of the filter circuit is switched to one that is suitable for the magnitude of the laser drive current, and ringing in the output waveform of the laser diode driver circuit is optimally suppressed.

Preferably, the laser diode driver circuit including the above switch control circuit further comprises a filter circuit connected to an output terminal through which the laser drive current is supplied to the laser diode, the filter circuit having a variable time constant. Herein, the filter circuit switches the time constant in conjunction with the control of the magnitude of the laser drive current by the optical output power control circuit.

As described above, according to a laser diode driver circuit of the present invention, ringing in the output waveform, which is caused due to the influence of the inductance and capacitive component parasitic to the laser diode driver circuit itself and a laser diode to be driven, is suppressed and the output waveform is shaped to be suitable for the magnitude of the laser drive current.

BEST MODE FOR CARRYING OUT THE INVENTION

Hereinafter, the best modes for carrying out the present invention will be described with reference to the drawings.

EMBODIMENT 1

Figure 1:
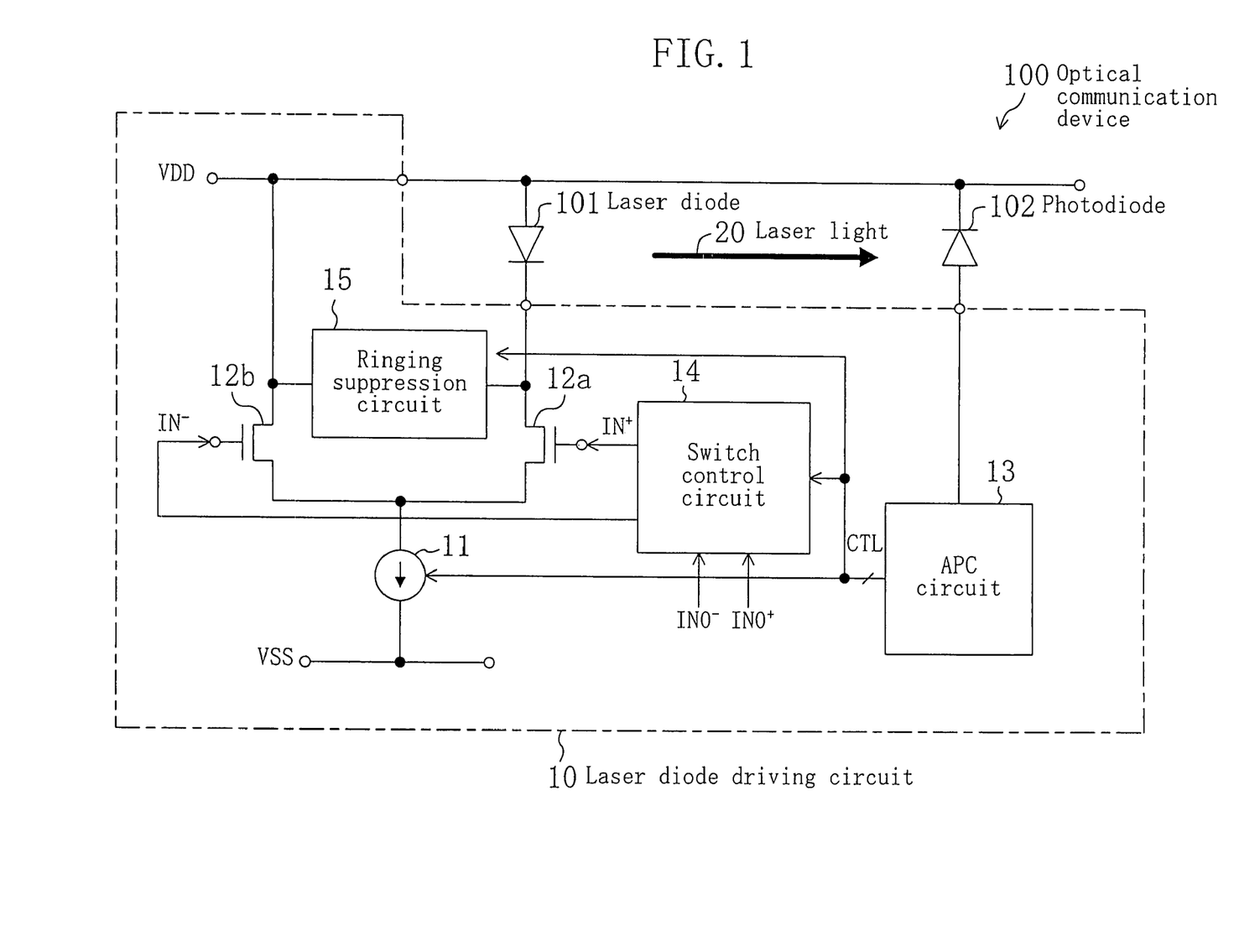
FIG. 1 shows a circuit structure of an optical communication device according to embodiment 1 of the present invention.

FIG. 1 shows a circuit structure of an optical communication device according to embodiment 1 of the present invention. The optical communication device 100 of embodiment 1 includes a laser diode 101, a photodiode 102 which functions as a light receiving element for monitoring the amount of laser light 20 output by the laser diode 101, and a laser diode driver circuit 10 for driving the laser diode 101. The laser diode driver circuit 10 of embodiment 1 includes: a current source 11 for generating a laser drive current which is used for driving the laser diode 101; switches 12a and 12b for switching the passage/non-passage of the laser drive current into the laser diode 101; an APC circuit (optical output power control circuit) 13 for controlling the magnitude of the laser drive current according to a monitoring result obtained by the photodiode 102 such that the optical output power of the laser diode 101 is equal to a predetermined value; a switch control circuit 14 for controlling the operation of the switches 12a and 12b according to input signals $IN0^+$ and $IN0^-$; and a ringing suppression circuit (filter circuit) 15 connected to an output terminal through which the laser drive current is supplied to the laser diode 101. The time constant of the ringing suppression circuit 15 is switchable.

In the laser diode driver circuit 10 of embodiment 1, the output waveform is optimized by the switch control circuit 14 and the ringing suppression circuit 15. Hereinafter, the switch control circuit 14 and the ringing suppression circuit 15 are described in detail.

Figure 2:
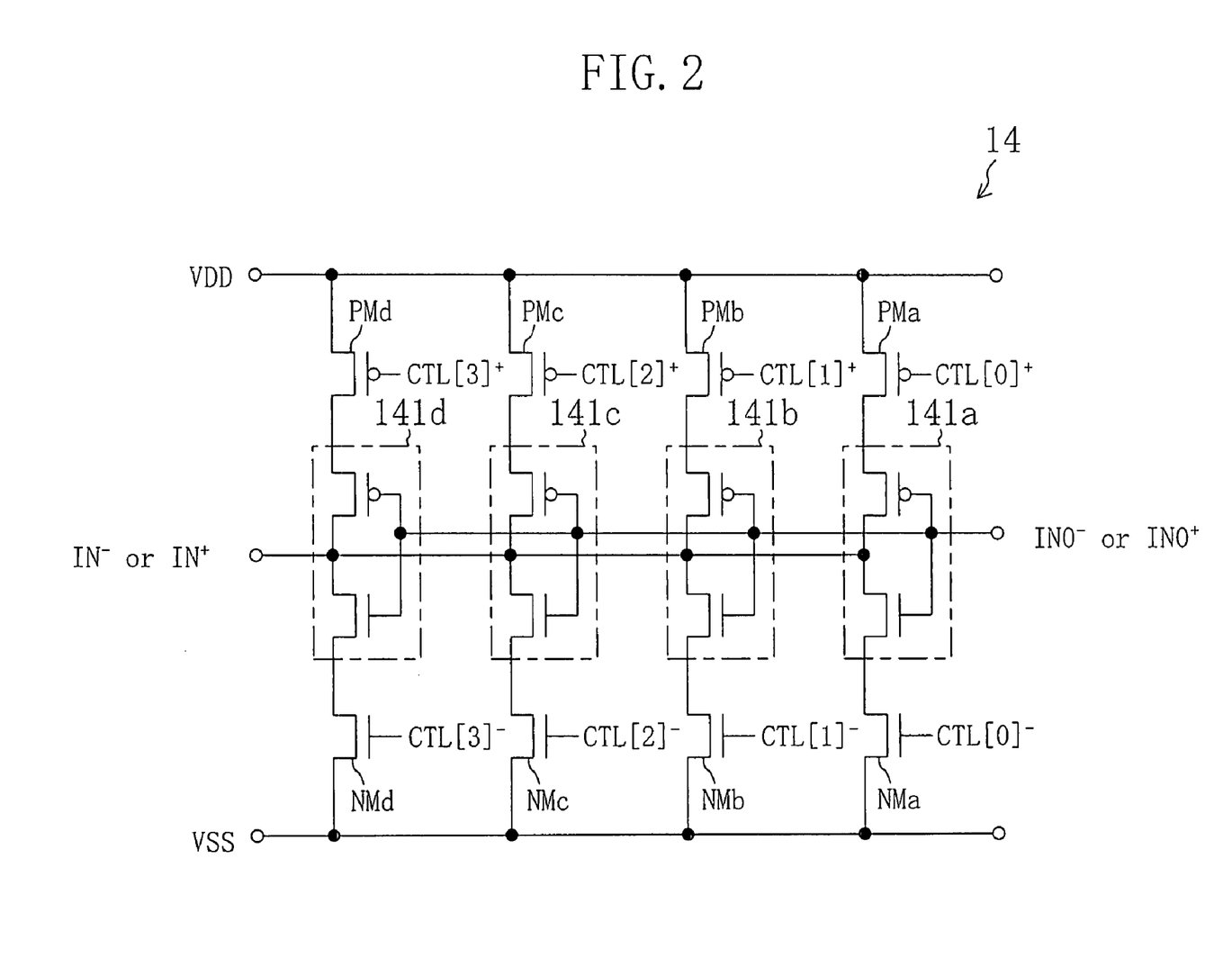
FIG. 2 shows a circuit structure of a switch control circuit according to embodiment 1 of the present invention.

FIG. 2 shows a circuit structure of the switch control circuit 14 of embodiment 1. The switch control circuit 14 includes buffer circuits 141a, 141b, 141c and 141d. Since the switches 12a and 12b shown in FIG. 1 are driven by the differential signal, the actual switch control circuit 14 includes two units of the circuit shown in FIG. 2 for output of signals IN+ and IN−.

The output terminals and input terminals of the buffer circuits 141a to 141d are respectively connected. Through these terminals, signal IN0+ (or IN0−) is input, and signal IN+(or IN−) is output. The buffer circuits 141a to 141d are connected to PMOS transistors PMa, PMb, PMc, and PMd and NMOS transistors NMa, NMb, NMc, and NMd, respectively. In each of the buffer circuits 141a to 141d, electrical connection and disconnection are switchable, i.e., the number of buffer circuits connected in parallel can be changed, by turning on/off the PMOS transistors PMa to PMd and the NMOS transistors NMa to NMd.

The PMOS transistors PMa to PMd are respectively controlled by signals $CTL[0]^+$, $CTL[1]^+$, $CTL[2]^+$ and $CTL[3]^+$ which are based on the bit value (0th bit to 3rd bit) of signal CTL. The PMOS transistors PMa to PMd are respectively controlled by signals $CTL[0]^-$, $CTL[1]^-$, $CTL[2]^-$ and $CTL[3]^-$ which are based on the bit value (0th bit to 3rd bit) of signal CTL. Signal CTL input to the switch control circuit 14 is the same as signal CTL which is output from the APC circuit 13 of FIG. 1 for controlling the current source 11.

As described above, the switch control circuit 14 changes the number of buffer circuits 141a to 141d connected in parallel in conjunction with the control of the laser drive current by the APC circuit 13. Specifically, the number of buffer circuits connected in parallel is increased when the laser drive current is controlled to be large. Conversely, the number of buffer circuits connected in parallel is decreased when the laser drive current is controlled to be small. The buffer size increases as the number of buffer circuits connected in parallel increases. That is, the drive power to the switches 12a and 12b increases. Conversely, the buffer size decreases as the number of buffer circuits connected in parallel decreases. That is, the drive power to the switches 12a and 12b decreases. Thus, the output waveform can be optimized by switching the drive power to the switches 12a and 12b according to the magnitude of the laser drive current of the laser diode 101.

It should be noted that the number of buffer circuits included in the switch control circuit 14 is not limited to 4 but may be any number. Further, the buffer circuits may have different sizes.

In the above example, signal CTL, which is output from the APC circuit 13 for controlling the current source 11, is also used for switching the drive power of the switch control circuit 14, but the present invention is not limited thereto. Any signal may be used so long as the signal changes in conjunction with the magnitude of the laser drive current generated by the current source 11.

Figure 3A:
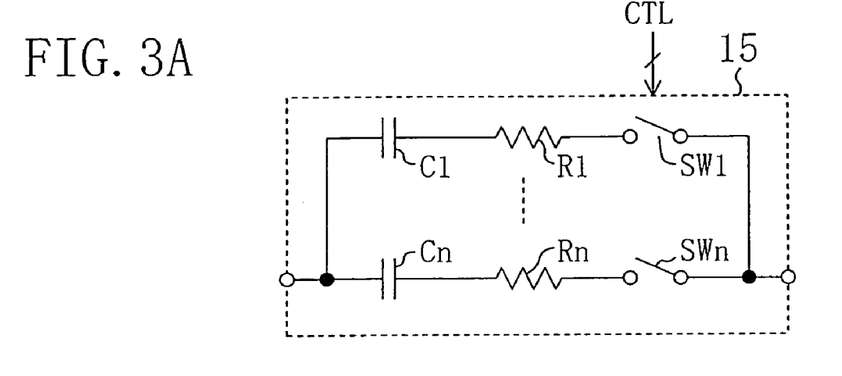
FIGS. 3A, 3B and 3C show circuit structure examples of ringing suppression circuits according to embodiment 1 of the present invention.
Figure 3B:
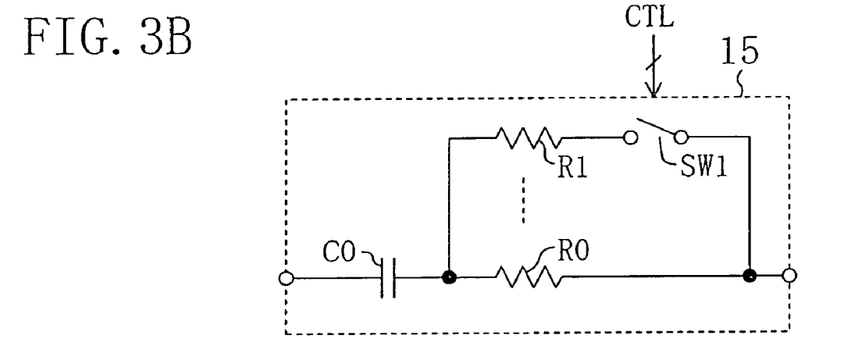
Figure 3C:
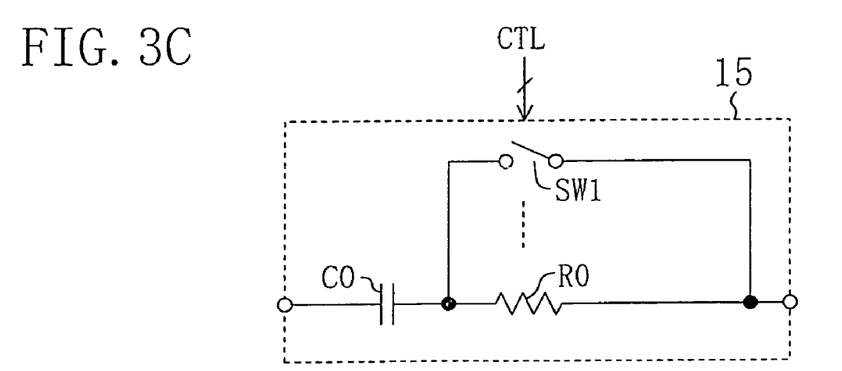

Next, the ringing suppression circuit 15 of embodiment 1 is described. FIGS. 3A, 3B and 3C show circuit structure examples of the ringing suppression circuit 15 according to embodiment 1.

The ringing suppression circuit 15 shown in FIG. 3A is formed by parallelly-connected circuit segments each including a capacitive element Ci (i is an integer from 1 to n (the same applies to the following examples)), a resistive element Ri, and a switch SWi which are connected in series. Each switch SWi is controlled by signal CTL which is output from the APC circuit 13 for controlling the current source 11.

The ringing suppression circuit 15 shown in FIG. 3B is formed by a common capacitive element CO, circuit segments each including a resistive element Ri and a switch SWi which are connected in series, and resistive element RO which is connected in parallel with the circuit segments. In this structure, the resistive value is switchable in consideration that the resistive element has the largest influence on the output waveform in the ringing suppression circuit 15. The ringing suppression circuit 15 shown in FIG. 3C is different from the ringing suppression circuit 15 shown in FIG. 3B in that the resistive element Ri of FIG. 3B is omitted, and the ON-resistance of the switch SWi is used as a substitute.

As described above, the ringing suppression circuit 15 switches the preset time constant in conjunction with the control of the magnitude of the laser drive current by the APC circuit 13, whereby ringing in the output waveform of the laser diode driver circuit 10 and blunt waveform at the rising and falling edges are prevented, and as a result, the output waveform is optimized.

Figure 4:
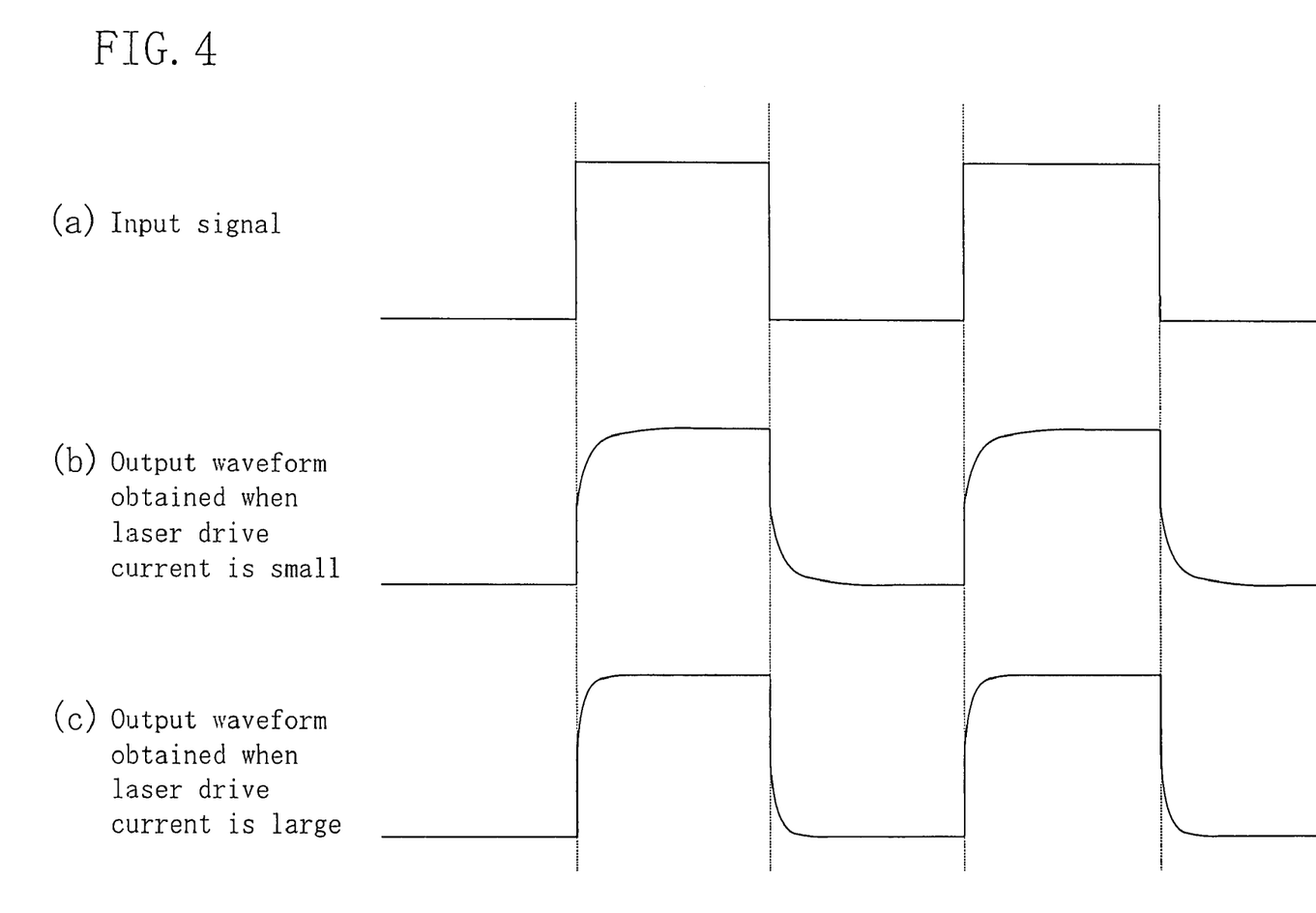
FIG. 4 is a graph illustrating the input/output characteristic of a laser diode driver circuit according to embodiment 1 of the present invention.

FIG. 4 is a graph illustrating the input/output characteristic of the laser diode driver circuit 10 according to embodiment 1. In FIG. 4, line segment (a) shows an input signal to the laser diode driver circuit 10 of embodiment 1; line segment (b) shows the output waveform obtained when the laser drive current is small; and line segment (c) shows the output waveform obtained when the laser drive current is large. As seen from the comparison of FIG. 4 and FIG. 11, the ringing, which would be seen in the conventional laser diode driver circuit when the laser drive current is small, is not caused in the laser diode driver circuit 10 of embodiment 1, and the blunt waveform, which would be seen in the conventional laser diode driver circuit when the laser drive current is large, is not caused in the laser diode driver circuit 10 of embodiment 1.

In FIG. 1, an end of the ringing suppression circuit 15 is connected to the drain of the switch 12b, but the present invention is not limited thereto. The end of the ringing suppression circuit 15 may be supplied with a predetermined voltage. For example, the end of the circuit 15 may be connected to a reference voltage terminal or GND terminal.

In the above example, signal CTL, which is output from the APC circuit 13 for controlling the current source 11, is also used for switching the time constant of the ringing suppression circuit 15, but the present invention is not limited thereto. Any signal may be used so long as the signal changes in conjunction with the magnitude of the laser drive current generated by the current source 11.

As described above, according to embodiment 1, the output waveform is optimized according to a variation in the magnitude of the laser drive current of the laser diode 101. Thus, in the optical communication device 100, the reliability of communication is further improved without deteriorating the high-speed processability of optical communication data.

Figure 5:
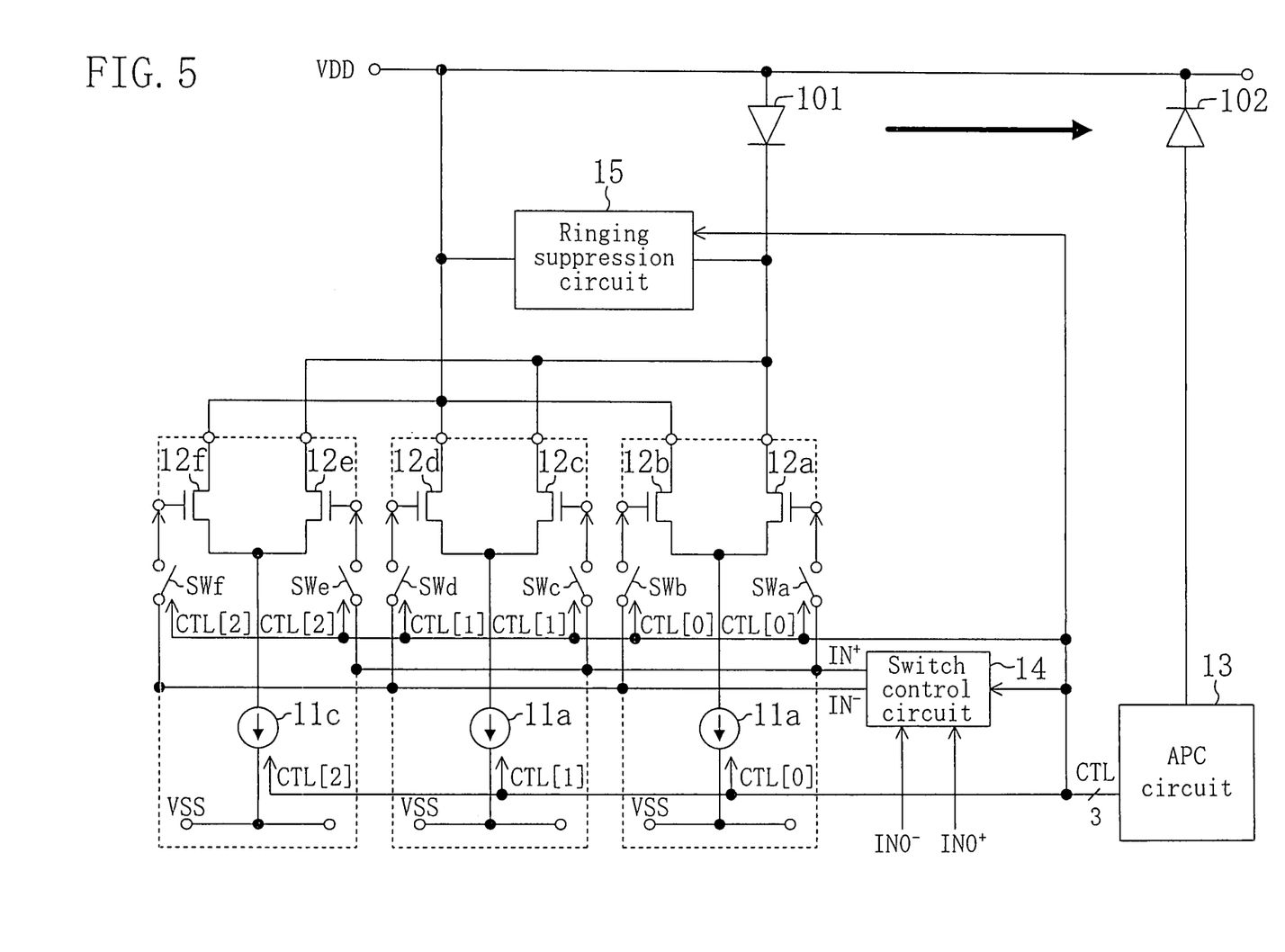
FIG. 5 shows a circuit structure of an optical communication device in which the size of the switch of FIG. 1 is variable.

The size of the switches 12a and 12b may be changed in conjunction with the control of the laser drive current of the laser diode 101. FIG. 5 shows a circuit structure of an optical communication device in which the switch size is variable. The current source 11 of FIG. 1 is formed, in actuality, by current sources 11a, 1b and 11c which are electrically connectable in parallel as shown in FIG. 5. The current source 11 switches the magnitude of the laser drive current according to signal CTL output by the APC circuit 13. With such a structure, the switch size is changed according to signal CTL.

Specifically, as shown in FIG. 5, the operations of the switches 12a, 12b, 12c, 12d, 12e and 12f are respectively controlled according to the connections of the current sources 11a, 11b and 11c. Therefore, it is only necessary to control the on/off state of a small-size switch when the laser drive current is small, and it is not necessary to operate a large-size switch with a small electric current. When the laser drive current is large, a large-size switch is turned on/off, and therefore, it is possible to output a large laser drive current. Thus, the output waveform is further optimized in respect of waveform shaping.

In FIG. 1 of FIG. 5, in the case where the optical communication device 100 accepts burst signals and the APC circuit 13 controls the laser drive current for each burst signal, it is preferable to adjust the magnitude of the laser drive current of the laser diode 101 for each burst signal. With this structure, the output level does not vary during the transfer of valid data, and the reliability of communication is further improved.

EMBODIMENT 2

Figure 6:
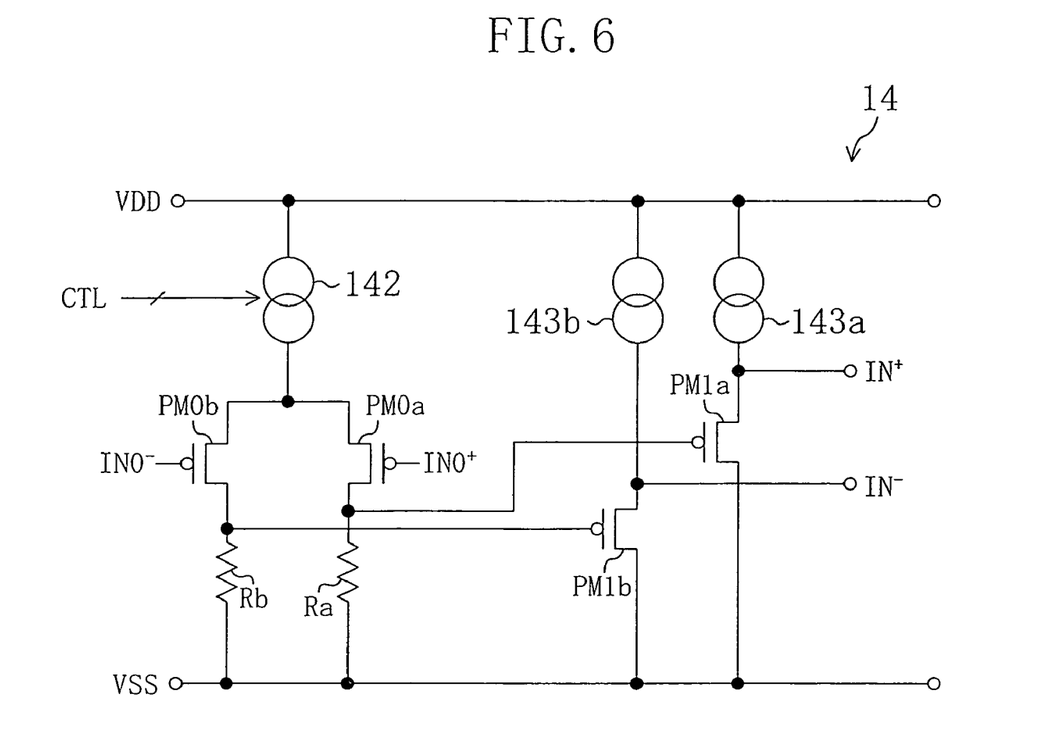
FIG. 6 shows a circuit structure of a switch control circuit in an optical communication device according to embodiment 2 of the present invention.

FIG. 6 shows a circuit structure of a switch control circuit in an optical communication device according to embodiment 2 of the present invention. The optical communication device of embodiment 2 is the same as the optical communication device 100 shown in FIG. 1 except for the switch control circuit 14. Hereinafter, the switch control circuit 14 of embodiment 2 is described while descriptions of the other components are omitted in this section.

The switch control circuit 14 of embodiment 2 includes current sources 142, 143a and 143b, resistive elements Ra and Rb connected to the ground, PMOS transistors PM0a and PM0b, and PMOS transistors PM1a and PM1b. The drains of the PMOS transistors PM0a and PM0b are connected to the resistive elements Ra and Rb, respectively. The gates of the PMOS transistors PM0a and PM0b are supplied with signals IN0$^+$ and IN0$^-$, respectively. The sources of the PMOS transistors PM0a and PM0b are connected to a current source 142. The drains of the PMOS transistors PM1a and PM1b are connected to the ground. The gates of the PMOS transistors PM1a and PM1b are connected to the PMOS transistors PM0a and PM0b, respectively. The sources of the PMOS transistors PM1a and PM1b are connected to the current sources 143a and 143b, respectively.

In the switch control circuit 14 having the above structure, the levels of signals which have the amplitudes determined by the resistive elements Ra and Rb and the current source 142 are converted by a source follower circuit which is formed by the current sources 143a and 143b and the PMOS transistors PM1a and PM1b and output as signals IN$^+$ and IN$^-$, respectively. Herein, the current source 142 is controlled by signal CTL, which is output from the APC circuit 13 for controlling the current source 11 as shown in FIG. 1, whereby the amplitudes of signals IN$^+$ and IN$^-$, i.e., the drive power to the switches 12a and 12b in FIG. 1, are switched in conjunction with the control of the magnitude of the laser drive current.

Figure 7:
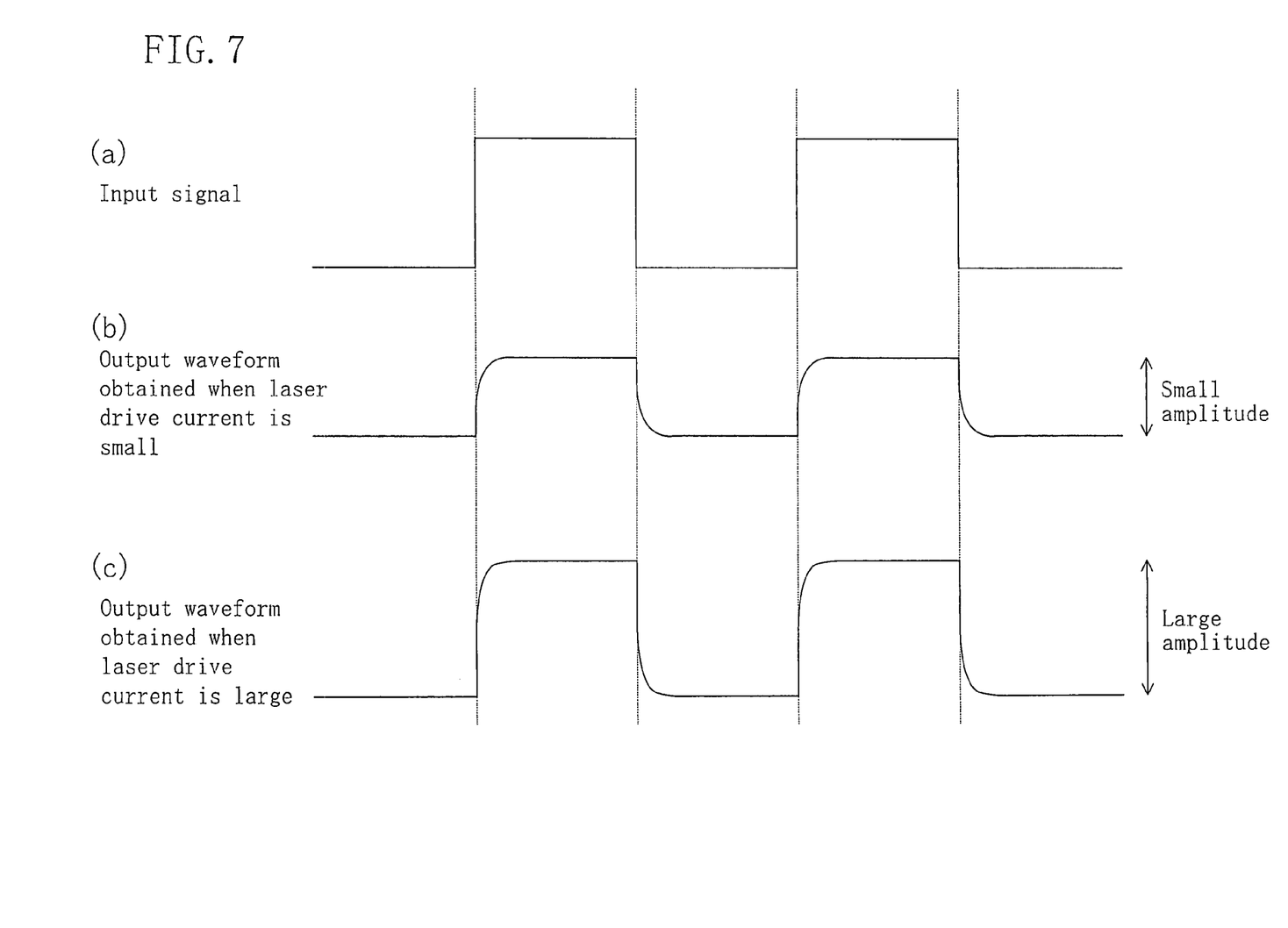
FIG. 7 is a graph illustrating the input/output characteristic of a switch control circuit according to embodiment 2 of the present invention.

FIG. 7 is a graph illustrating the input/output characteristic of the switch control circuit 14 according to embodiment 2. In FIG. 7, line segment (a) shows an input signal to the switch control circuit 14; line segment (b) shows the output waveform obtained when the laser drive current is small; and line segment (c) shows the output waveform obtained when the laser drive current is large. As shown in FIG. 7, when the laser drive current is controlled to be large, the amplitudes of signals IN$^+$ and IN$^-$ are increased. When the laser drive current is controlled to be small, the amplitudes of signals IN$^+$ and IN$^-$ are decreased.

As described above, the switch control circuit 14 of embodiment 2 switches the amplitudes of signals IN$^+$ and IN$^-$ for controlling the switches 12a and 12b, i.e., the drive power to the switches 12a and 12b, in conjunction with the control of the magnitude of the laser drive current of the laser diode 101 in FIG. 1.

As described above, according to embodiment 2, the output waveform is optimized according to a variation in the magnitude of the laser drive current of the laser diode 101. Thus, in the optical communication device 100, the reliability of communication is further improved without deteriorating the high-speed processability of optical communication data.

It should be noted that the current source 142 may be formed by a constant current source, and the resistive elements Ra and Rb may be formed by variable resistive elements. Alternatively, a plurality of circuits each of which outputs signals IN$^+$ and IN$^-$ having predetermined amplitudes may be provided. In this case, the plurality of circuits are switched to switch the amplitudes of signals IN$^+$ and IN$^-$.

In embodiments 1 and 2, the switches 12a and 12b are controlled by the differential signal, but the present invention is not limited thereto. For example, a predetermined voltage may be supplied to the switch 12b instead of signal IN$^-$ while the switch 12a is controlled only by signal IN$^+$.

In embodiments 1 and 2, any one of the switch control circuit 14 and the ringing suppression circuit 15 may be omitted. For example, if prevention of the output waveform of the laser diode driver circuit 10 from being blunted is more important than prevention of ringing in the output waveform, only the switch control circuit 14 may be provided. Conversely, if prevention of ringing in the output waveform of the laser diode driver circuit 10 is more important than prevention of the output waveform from being blunted, only the ringing suppression circuit 15 may be provided. It should be noted, however, that providing only the ringing suppression circuit 15 can be insufficient for optimizing the output waveform of the laser diode driver circuit 10, for example, when the variation range of the laser drive current is very large, when ringing frequently occurs due to considerably large parasitic inductance and parasitic capacitance component in some types of the laser diode 101, or when the communication distance is relatively long. Thus, in such a case, it is preferable to provide both the switch control circuit 14 and the ringing suppression circuit 15.

EMBODIMENT 3

Figure 8:
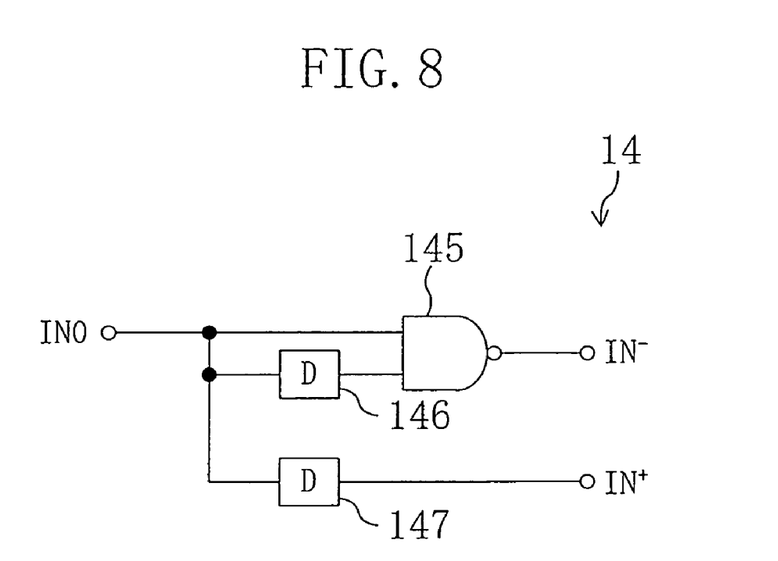
FIG. 8 shows a circuit structure of a switch control circuit in an optical communication device according to embodiment 3 of the present invention.

FIG. 8 shows a circuit structure of a switch control circuit in an optical communication device according to embodiment 3 of the present invention. The optical communication device of embodiment 3 is the same as the optical communication device 100 shown in FIG. 1 except for the switch control circuit 14. Hereinafter, the switch control circuit 14 of embodiment 3 is described while descriptions of the other components are omitted in this section.

The switch control circuit 14 of embodiment 3 includes an NAND circuit 145 and delay circuits 146 and 147. The delay circuit 147 delays signal IN0, which is the original signal of signals IN$^+$ and IN$^-$ used for controlling the switches 12a and 12b of FIG. 1, to output a resultant signal as signal IN$^+$. The NAND circuit 145 inverts the logical product of signal IN0 and a signal obtained by delaying signal IN0 to output a resultant signal as signal IN$^-$.

Figure 9:
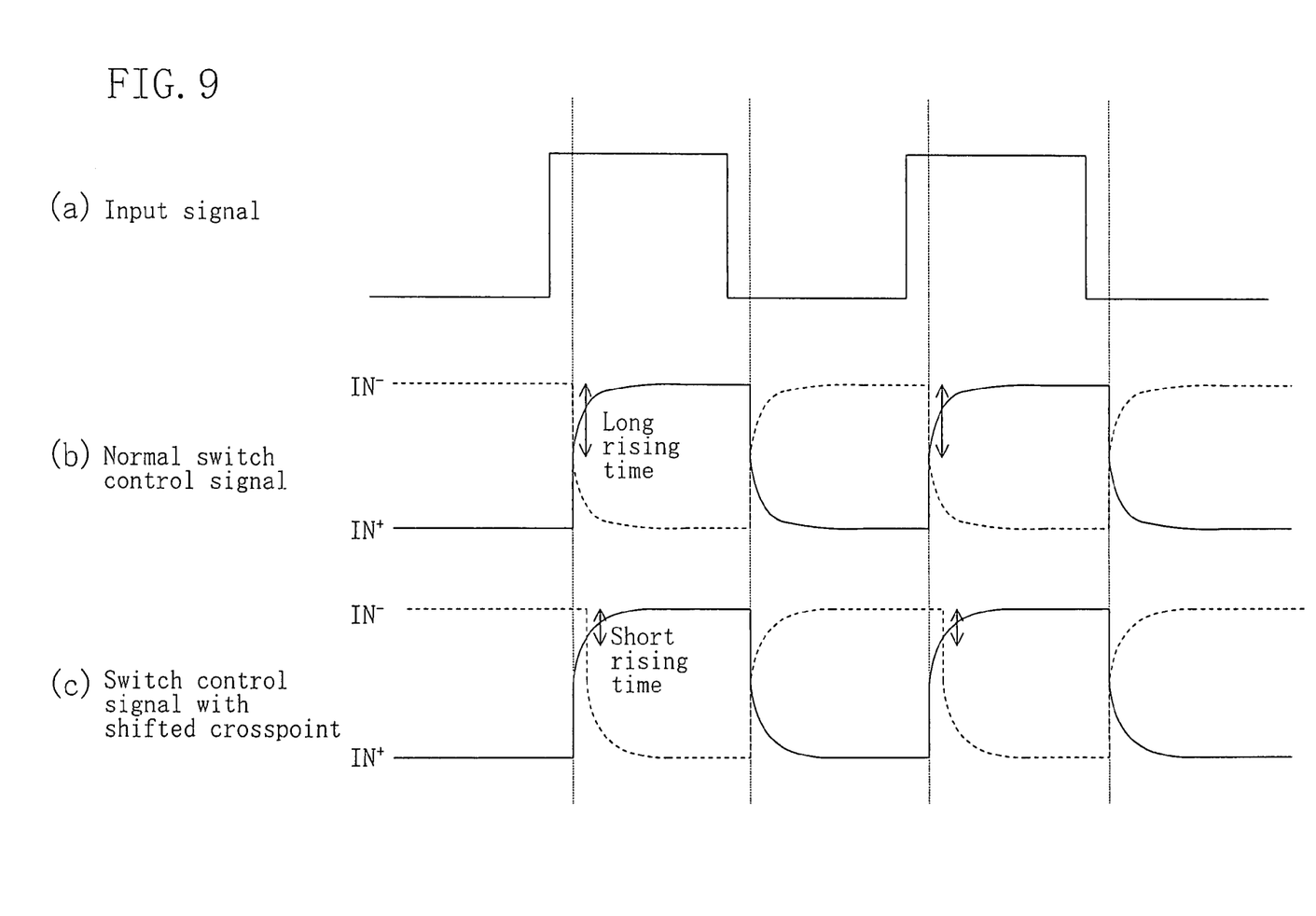
FIG. 9 is a graph illustrating the input/output characteristic of a switch control circuit according to embodiment 3 of the present invention.

FIG. 9 is a graph illustrating the input/output characteristic of the switch control circuit 14 according to embodiment 3. In FIG. 9, line segment (a) shows an input signal to the switch control circuit 14, i.e., signal IN0; line segment (b) shows a normal differential signal (signals IN$^+$ and IN$^-$); and line segment (c) shows a differential signal of embodiment 3

(signals IN⁺ and IN⁻). As seen from line segment (c) of FIG. 9, in the differential signal of embodiment 3, the falling of signal IN is delayed with respect to the rising of signal IN⁺. Thus, the crosspoint of the differential signal is shifted from the crosspoint of the normal differential signal shown in line segment (b) of FIG. 9. As a result, the time required for signal IN⁺ to rise from the crosspoint to the high level becomes shorter. In the output waveform of the laser diode driver circuit 10 of FIG. 1, ringing caused due to overshoot occurs when signal IN⁺ rises. Thus, overshoot is prevented by shortening the time required for signal IN⁺ to rise from the crosspoint to the high level.

As described above, according to embodiment 3, overshoot in the output waveform of the laser diode driver circuit 10 is prevented. As a result, in the case where the laser diode driver circuit 10 of FIG. 1 is driven with high speed, a stable laser light output is obtained.

The delay circuits 146 and 147 may be formed by logic circuits or may be other elements capable of delay setting.

The switch control circuit 14 may have a circuit structure different from that of the above-described example so long as the falling of signal IN⁻ is delayed with respect to the rising of signal IN⁺.

In the above-described embodiments of the present invention, a resistive element, a capacitive element and an inductance may be inserted between the drain of the switch 12b and power supply VDD for the purpose of waveform shaping, instead of directly connecting the drain of the switch 12b to power supply VDD.

As described above, in a laser diode driver circuit of the present invention, the output waveform is optimized according to a wide variation in the laser drive current. Thus, the laser diode driver circuit of the present invention is especially useful for driving of a laser diode in an optical communication device which performs high speed optical data communication.

What is claimed is:

1. A laser diode driver circuit for driving a laser diode, comprising:
    a current source for generating a laser drive current which is used for driving the laser diode;
    a switch for switching the passage/non-passage of the laser drive current into the laser diode;
    an optical output power control circuit for controlling the magnitude of the laser drive current based on a monitoring result as to the optical output power of the laser diode such that the optical output power is equal to a predetermined value; and
    a switch control circuit for controlling the operation of the switch according to an input signal,
    wherein the switch control circuit switches the drive power to the switch in conjunction with the control of the magnitude of the laser drive current by the optical output power control circuit,
    wherein when the laser drive current is controlled to be large, the switch control circuit increases the drive power; and
    when the laser drive current is controlled to be small, the switch control circuit decreases the drive power,
    wherein the switch control circuit includes a plurality of buffer circuits between which electrical connection and disconnection are switchable; and
    the switch control circuit switches the drive power by changing the number of buffer circuits connected in parallel.

2. A laser diode driver circuit for driving a laser diode, comprising:
    a current source for generating a laser drive current which is used for driving the laser diode;
    a switch for switching the passage/non-passage of the laser drive current into the laser diode;
    an optical output power control circuit for controlling the magnitude of the laser drive current based on a monitoring result as to the optical output power of the laser diode such that the optical output power is equal to a predetermined value; and
    a filter circuit connected to an output terminal through which the laser drive current is supplied to the laser diode, the filter circuit having a variable time constant,
    wherein the filter circuit switches the time constant in conjunction with the control of the magnitude of the laser drive current by the optical output power control circuit.

3. An optical communication device comprising a laser diode, a light receiving element for monitoring the optical output of the laser diode, and a laser diode driver circuit for driving the laser diode, the optical communication device driving the laser diode according to an input signal to emit light for data communication, the laser diode driver circuit including
    a current source for generating a laser drive current which is used for driving the laser diode,
    a switch for switching the passage/non-passage of the laser drive current into the laser diode,
    an optical output power control circuit for controlling the magnitude of the laser drive current based on a monitoring result obtained by the receiving element such that the optical output power of the laser diode is equal to a predetermined value, and
    a filter circuit connected to an output terminal through which the laser drive current is supplied to the laser diode, the filter circuit having a variable time constant,
    wherein the filter circuit switches the time constant in conjunction with the control of the magnitude of the laser drive current by the optical output power control circuit.

4. The optical communication device of claim 3, wherein the optical output power control circuit controls the magnitude of the laser drive current for each burst signal.

* * * * *